US009357631B2

(12) United States Patent
Ho et al.

(10) Patent No.: US 9,357,631 B2
(45) Date of Patent: May 31, 2016

(54) FLEXIBLE PRINTED CIRCUIT BOARD AND METHOD FOR MAKING SAME

(71) Applicants: FuKui Precision Component (Shenzhen) Co., Ltd., Shenzhen (CN); Zhen Ding Technology Co., Ltd., Tayuan, Taoyuan (TW)

(72) Inventors: Ming-Jaan Ho, New Taipei (TW); Xian-Qin Hu, Shenzhen (CN); Shao-Hua Wang, Shenzhen (CN); Fu-Yun Shen, Shenzhen (CN)

(73) Assignees: FuKui Precision Component (Shenzhen) Co., Ltd., Shenzhen (CN); Zhen Ding Technology Co., Ltd., Tayuan, Taoyuan (TW)

( * ) Notice: Subject to any disclaimer, the term of this patent is extended or adjusted under 35 U.S.C. 154(b) by 2 days.

(21) Appl. No.: 14/162,769

(22) Filed: Jan. 24, 2014

(65) Prior Publication Data

US 2015/0034364 A1 Feb. 5, 2015

(30) Foreign Application Priority Data

Jul. 31, 2013 (CN) .................. 2013 1 03277488

(51) Int. Cl.
*H05K 1/02* (2006.01)
*H05K 1/03* (2006.01)
*H05K 3/28* (2006.01)

(52) U.S. Cl.
CPC ............ *H05K 1/0215* (2013.01); *H05K 1/0216* (2013.01); *H05K 1/0393* (2013.01); *H05K 3/288* (2013.01); *H05K 2201/0116* (2013.01); *H05K 2201/0145* (2013.01); *H05K 2201/0154* (2013.01); *H05K 2201/2009* (2013.01); *H05K 2203/0221* (2013.01); *H05K 2203/095* (2013.01); *H05K 2203/1194* (2013.01)

(58) Field of Classification Search
None
See application file for complete search history.

(56) References Cited

U.S. PATENT DOCUMENTS

| | | | | |
|---|---|---|---|---|
| 4,715,894 A * | 12/1987 | Holtzman | ............ | H05K 3/244 106/1.22 |
| 5,065,228 A * | 11/1991 | Foster et al. | .................. | 257/698 |
| 5,897,188 A * | 4/1999 | Sasuga | ............. | G02F 1/133308 349/149 |
| 6,252,176 B1 * | 6/2001 | Kuramochi | ............ | H05K 1/024 174/254 |
| 6,270,835 B1 * | 8/2001 | Hunt | ...................... | H01G 4/085 29/25.41 |
| 2002/0043660 A1 * | 4/2002 | Yamazaki | ........... | H01L 27/1281 257/59 |
| 2002/0176989 A1 * | 11/2002 | Knudsen | ................ | H01G 4/206 428/408 |
| 2003/0082889 A1 * | 5/2003 | Maruyama | .......... | H01L 27/1214 438/455 |
| 2003/0116343 A1 * | 6/2003 | Adachi | .................. | H05K 1/028 174/254 |

(Continued)

FOREIGN PATENT DOCUMENTS

| | | |
|---|---|---|
| TW | 248190 M | 10/2004 |
| TW | 200910569 A | 3/2009 |
| TW | 201206332 A | 2/2012 |

*Primary Examiner* — Jeremy C Norris
*Assistant Examiner* — Muhammed Azam
(74) *Attorney, Agent, or Firm* — Novak Druce Connolly Bove + Quigg LLP

(57) ABSTRACT

An FPCB includes a flexible base, a wiring layer formed on a top surface of the base, a covering layer formed on the wiring layer, and a shielding layer formed on a portion of the covering layer. The wiring layer includes a grounding line. The covering layer defines an opening to expose the grounding line to the outside. A portion of the shielding layer fills into the opening. The shielding layer is electrically connected to the grounding line through the opening.

12 Claims, 11 Drawing Sheets

(56) References Cited

U.S. PATENT DOCUMENTS

| | | | |
|---|---|---|---|
| 2003/0206376 A1* | 11/2003 | Erpelding | G11B 5/486 360/245.9 |
| 2005/0155788 A1* | 7/2005 | Benson | 174/255 |
| 2005/0162835 A1* | 7/2005 | Kogure et al. | 361/720 |
| 2008/0151151 A1* | 6/2008 | Fujikawa | G02F 1/136227 349/106 |
| 2008/0153039 A1* | 6/2008 | Akimoto | H01L 21/263 430/313 |
| 2008/0259575 A1* | 10/2008 | Tanimura et al. | 361/749 |
| 2010/0155109 A1* | 6/2010 | Takahashi | H05K 1/028 174/254 |
| 2010/0170701 A1* | 7/2010 | Takeuchi | B32B 7/12 174/254 |
| 2011/0036619 A1* | 2/2011 | Uratsuji | H05K 1/0218 174/254 |
| 2013/0098665 A1* | 4/2013 | Ishii et al. | 174/254 |
| 2013/0341072 A1* | 12/2013 | Lin et al. | 174/254 |
| 2014/0048310 A1* | 2/2014 | Montevirgen et al. | 174/250 |

* cited by examiner

FLEXIBLE PRINTED CIRCUIT BOARD AND METHOD FOR MAKING SAME

BACKGROUND

1. Technical Field

The present disclosure relates to technologies for manufacturing printed circuit boards (PCBs), and particularly to a flexible PCB (FPCB) having a relatively low cost, and a method for making the FPCB.

2. Description of Related Art

With the progress of technology, more and more concentrated circuits are arranged on FPCBs. However, the concentrated circuits on the FPCB may induce electro-magnetic interference (EMI), which inhibits performance of the FPCB. A conductive fabric may be employed to shield the EMI. However, the conductive fabric usually has a complex structure and a high cost, which increases manufacturing difficulty and costs of the FPCB.

Therefore, what are needed are an FPCB and a method for making the FPCB addressing the limitations described.

BRIEF DESCRIPTION OF THE DRAWING

The components of the drawing are not necessarily drawn to scale, the emphasis instead being placed upon clearly illustrating the principles of the embodiments of the present disclosure.

DETAILED DESCRIPTION

The disclosure is illustrated by way of example and not by way of limitation in the figures of the accompanying drawings in which like references indicate similar elements. It should be noted that references to "an" or "one" embodiment in this disclosure are not necessarily to the same embodiment, and such references mean "at least one." The references "a plurality of" and "a number of" mean "at least two."

FIGS. 1-11 illustrate a method for making a flexible printed circuit board (FPCB) 100.

Figure 1:
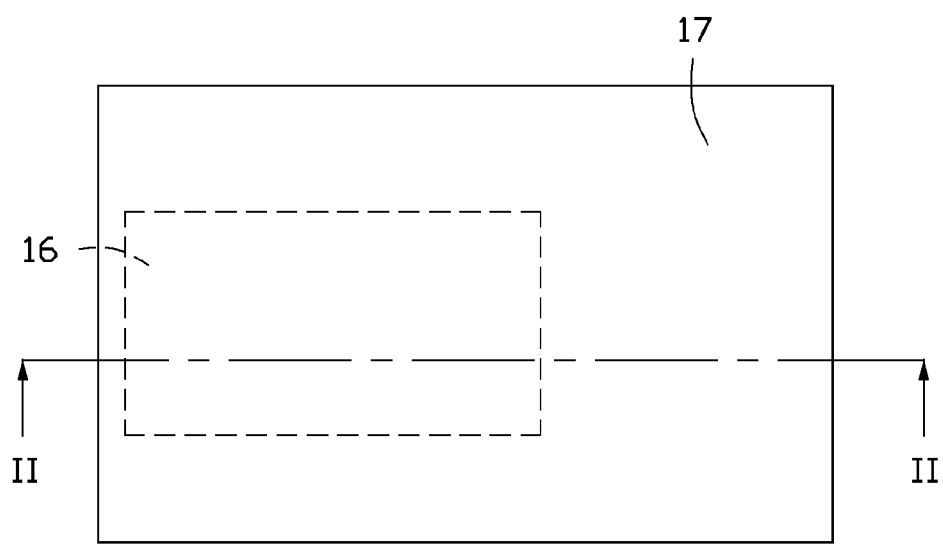
FIGS. 1-11 are schematic views of an embodiment of a method for making an FPCB.
Figure 2:
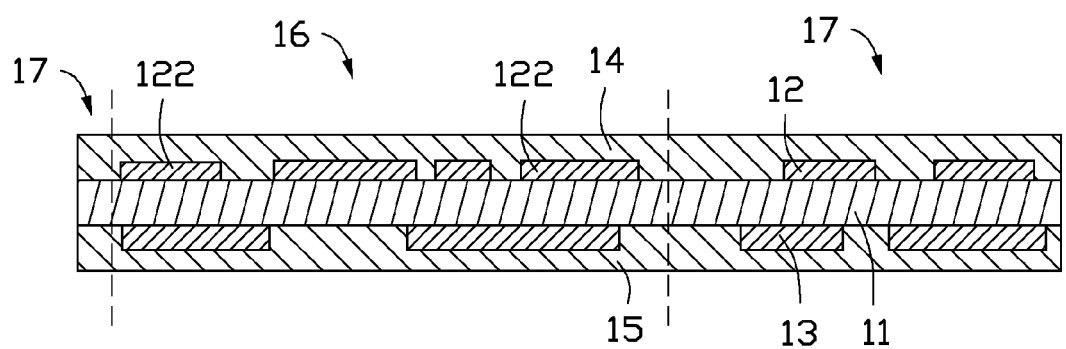

FIGS. 1-2 show that a flexible wiring board 10 is provided, wherein FIG. 2 is a cross section view of the flexible wiring board 10 of FIG. 1 taken along line II-II. The flexible wiring board 10 includes a flexible base 11, a first wiring layer 12 formed on a top surface of the base 11, a second wiring layer 13 formed on a bottom surface of the base 11, a first covering layer 14 covering the first wiring layer 12, and a second covering layer 15 covering the second wiring layer 13. In one embodiment, the base 11 is made from flexible material, such as polyimide (PI), polyethylene terephthalate (PET), or polyethylene naphthalate (PEN). Alternatively, the flexible wiring board 10 can be a multi-layer board, which includes a number of alternately arranged bases and wiring layers. In one embodiment, the first wiring layer 12 and the second wiring layer 13 are made of copper and formed by a selective etching process. The flexible wiring board 10 includes an EMI shielding area 16 and a common area 17 outside the shielding area 16. Portions of the first wiring layer 12 within the shielding area 16 are grounding lines 122.

Figure 3:
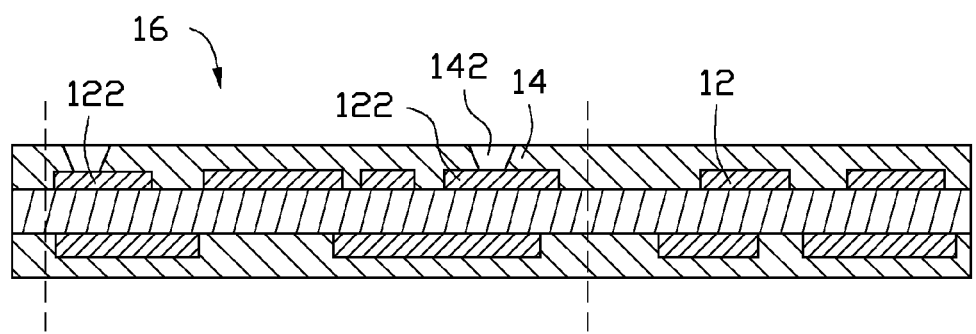

FIG. 3 shows that a number of openings 142 are defined in the first covering layer 14 within the EMI shielding area 16. Some of the grounding lines 122 are exposed to the outside through the openings 142. In one embodiment, the openings 142 can be formed by a punching process before laminating on the first wiring layer 12. In other embodiment, the opening 142 can be processed by a layer ablation process.

Figure 4:
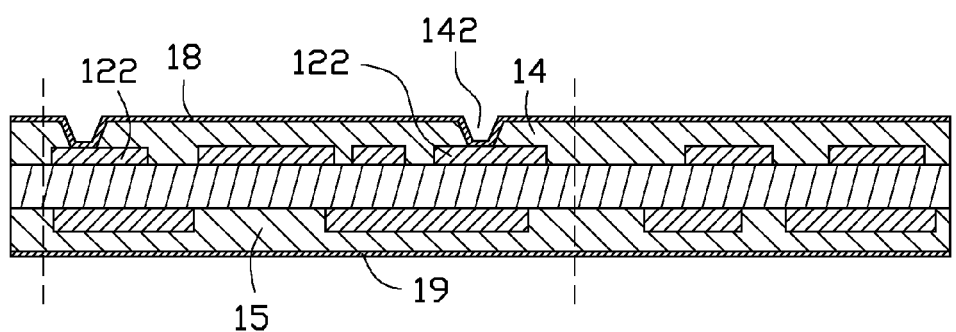

FIG. 4 shows that a first seed layer 18 and a second seed layer 19 are formed. The first seed layer 18 covers the first covering layer 14, inner surfaces of each of the openings 142, and portions of the grounding lines 122 exposed through the openings 142. The second seed layer 19 covers the second covering layer 14. In one embodiment, the first seed layer 18 and the second seed layer 19 are formed by an electroless process, such as a chemical electroplating process, and the first seed layer 18 and the second seed layer 19 are made of copper.

Before the first seed layer 18 and the second seed layer 19 are formed, surfaces of the flexible wiring board 10 to be covered by the first seed layer 18 and the second seed layer 19 undergo a pretreatment process. The pretreatment process removes pollutants from the surfaces, thereby enhancing an adhesive force of the first seed layer 18 and the second seed layer 19 on the corresponding surfaces of the flexible wiring board 10. The pretreatment process can be a plasma treatment process, a pumice process, or other suitable process.

Figure 5:
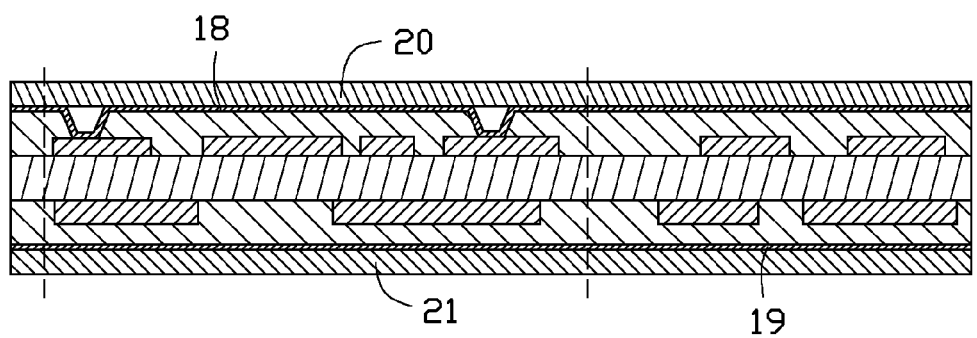

FIG. 5 shows that a first photoresist layer 20 is formed on the first seed layer 18, and a second photoresist layer 21 is formed on the second seed layer 19. In one embodiment, the first photoresist layer 20 and the second photoresist layer 21 are made of a photosensitive material.

Figure 6:
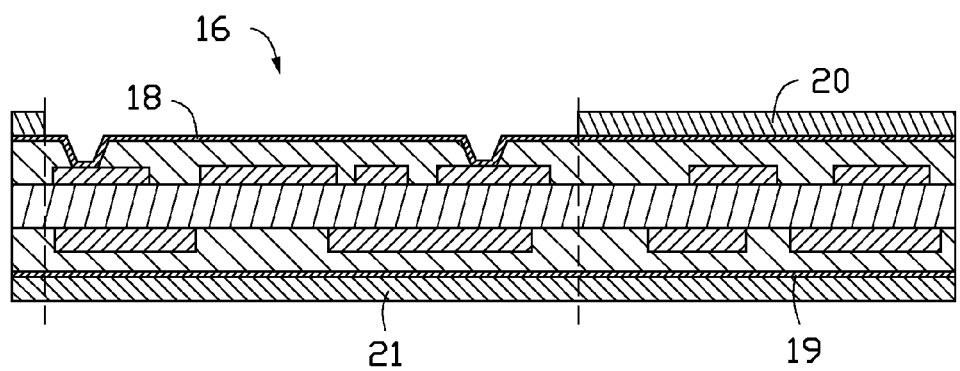

FIG. 6 shows that a portion of the first photoresist layer 20 on the first seed layer 18 in the EMI shielding area 16 is removed. Thus, a portion of the first seed layer 18 in the EMI shielding area 16 is exposed to the outside. The portion of the first photoresist layer 20 is removed by an exposing/developing process.

Figure 7:
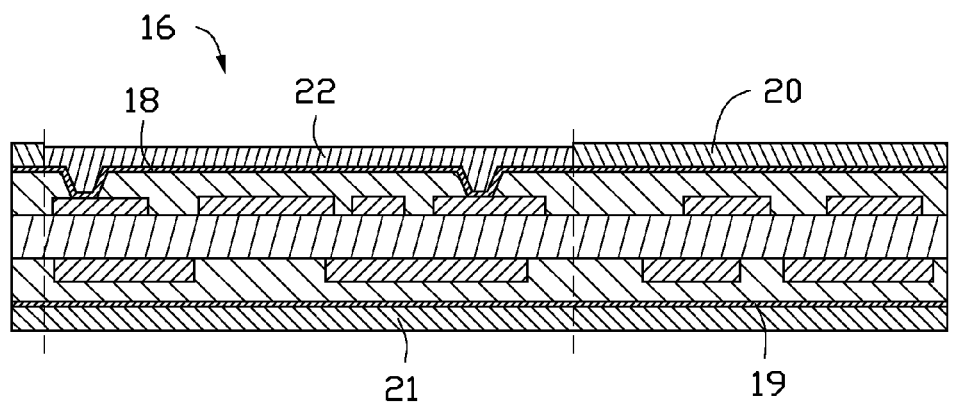

FIG. 7 shows that a shielding layer 22 is formed on the portion of the first seed layer 18 exposed to the outside. The openings 142 are filled with the shielding layer 22. In one embodiment, the shielding layer 22 is formed by a electroplating process, and the shielding layer 22 is made of copper.

Figure 8:
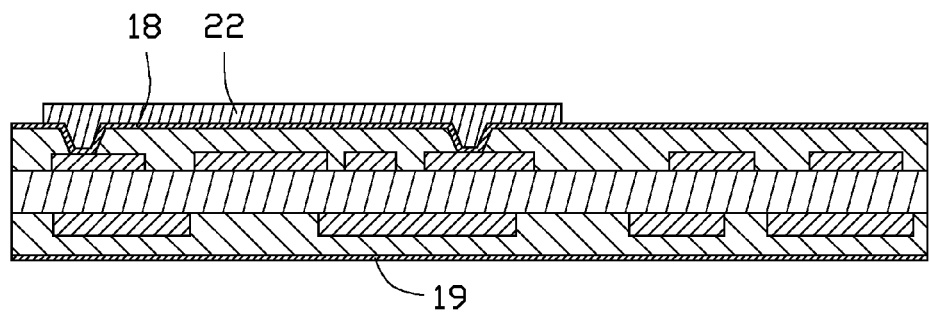

FIG. 8 shows that the first photoresist layer 20 and the second photoresist layer 21 are removed.

Figure 9:
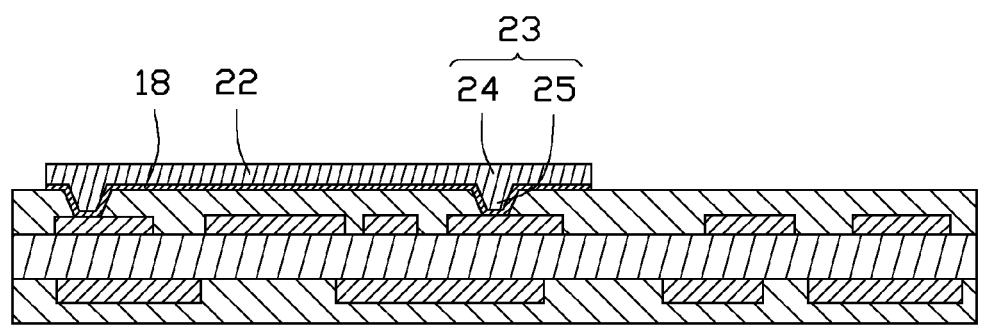

FIG. 9 shows that the first seed layer 18 in the common area 17, as well as the second seed layer 19, are removed. In one embodiment, the first seed layer 18 and the second seed layer 19 are removed by a micro-etching process. The first seed layer 18 in the EMI shielding area, together with the shielding layer 22, form an EMI shielding structure 23. The shielding layer 22 and the first seed layer 18 serve as EMI shielding layers 24 of the EMI shielding structure 23. The openings 142 serve as vias 25 for electrically connecting the EMI shielding structure 23 to the grounding lines 122.

Figure 10:
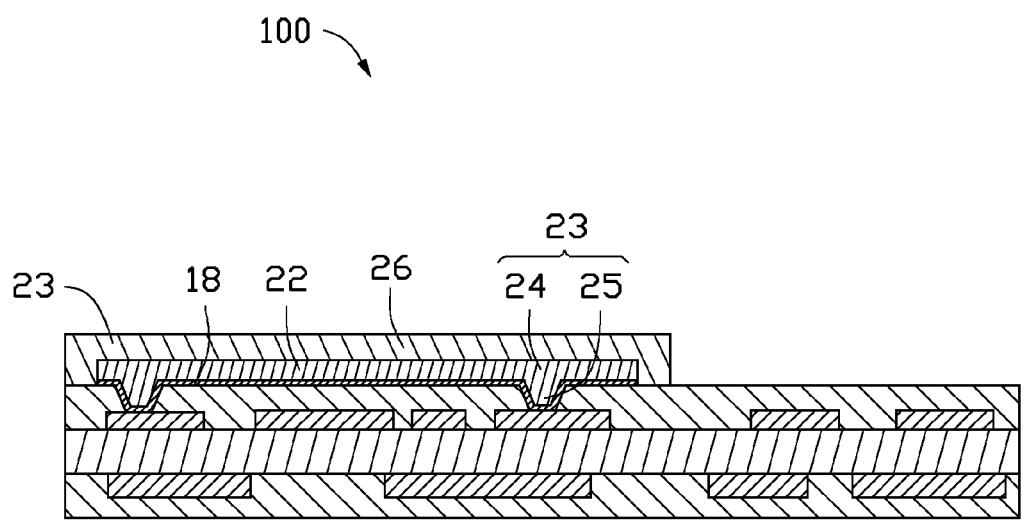
Figure 11:
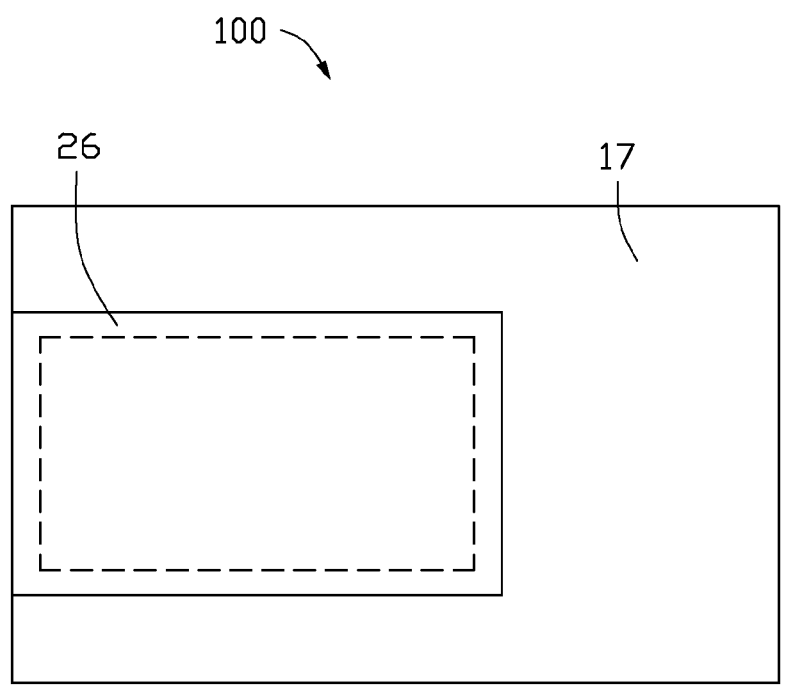

FIGS. 10-11 show that a solder resist layer 26 is formed on the EMI shielding layer 24 to form a final FPCB 100, wherein FIG. 11 is a plan view of the FPCB of the FIG. 10. The solder resist layer 26 protects the EMI shielding layer 24 from external impact. In one embodiment, the solder resist layer 26 covers a top surface and peripheral surfaces of the EMI shielding layer 24.

As described above, the EMI shielding structure 23 is formed on the first covering layer 14. However, it is understood that in other embodiments, the EMI shielding structure 23 can also be formed on the second covering layer 15. Furthermore, a shape and size of the EMI shielding area 16 can be adjusted according to different requirements. For example, the EMI shielding structure 23 can be formed on an entire surface of the first covering layer 14 and/or on the second covering layer 15.

It is believed that the present embodiments and their advantages will be understood from the foregoing description, and it will be apparent that various changes may be made thereto without departing from the spirit and scope of the disclosure or sacrificing all of its material advantages, the examples hereinbefore described merely being exemplary embodiments of the disclosure.

What is claimed is:

1. A flexible printed circuit board (FPCB), comprising:
a flexible base;
a first wiring layer formed on a side surface of the base, the first wiring layer comprising a grounding line; a first covering layer covering the first wiring layer, the first covering layer defining an opening exposing the grounding line; and
a shielding layer is formed on a portion of the first covering layer by an electroplating process, the opening filled with the shielding layer, the shielding layer being electrically connected to the grounding line through the opening.

2. The FPCB of claim 1, wherein the FPCB comprises a solder resist layer covering the shielding layer.

3. The FPCB of claim 1, wherein the FPCB comprises a first seed layer formed between the shielding layer and the first covering layer, the shielding layer is electrically connected to the grounding line by the first seed layer.

4. The FPCB of claim 3, wherein a material of the first seed layer is copper.

5. The FPCB of claim 1, wherein a material of the base is selected from a group consisting of polyimide, polyethylene terephthalate, and polyethylene naphthalate.

6. The FPCB of claim 1, comprising:
a second wiring layer formed on another side surface of the base facing away from the first wiring layer; and
a second covering layer covering the second wiring layer.

7. The FPCB of claim 1, wherein the flexible base comprises a number of alternately arranged bases and wiring layers.

8. The FPCB of claim 7, wherein the FPCB comprises a first seed layer formed between the shielding layer and the first covering layer, the shielding layer is electrically connected to the grounding line by the first seed layer.

9. The FPCB of claim 8, wherein the first seed layer covers a portion of the first cover layer, inner surface of the opening, and a portion of the ground lines exposed through the opening.

10. The FPCB of claim 9, wherein the FPCB comprises a solder resist layer covering the shielding layer.

11. The FPCB of claim 9, wherein a material of the base is selected from a group consisting of polyimide, polyethylene terephthalate, and polyethylene naphthalate.

12. The FPCB of claim 9, comprising:
a second wiring layer formed on another side surface of the base facing away from the first wiring layer; and
a second covering layer covering the second wiring layer.

* * * * *